US009508881B2

(12) United States Patent
Tauke-Pedretti et al.

(10) Patent No.: US 9,508,881 B2
(45) Date of Patent: Nov. 29, 2016

(54) TRANSPARENT CONTACTS FOR STACKED COMPOUND PHOTOVOLTAIC CELLS

(71) Applicant: Sandia Corporation, Albuquerque, NM (US)

(72) Inventors: Anna Tauke-Pedretti, Albuquerque, NM (US); Jeffrey Cederberg, Albuquerque, NM (US); Gregory N. Nielson, Albuquerque, NM (US); Murat Okandan, Edgewood, NM (US); Jose Luis Cruz-Campa, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 450 days.

(21) Appl. No.: 13/649,238

(22) Filed: Oct. 11, 2012

(65) Prior Publication Data

US 2014/0102520 A1 Apr. 17, 2014

(51) Int. Cl.
*H01L 31/043* (2014.01)
*H01L 31/0687* (2012.01)
*H01L 31/0693* (2012.01)
*H01L 31/18* (2006.01)

(52) U.S. Cl.
CPC ......... *H01L 31/043* (2014.12); *H01L 31/0687* (2013.01); *H01L 31/0693* (2013.01); *H01L 31/1844* (2013.01); *Y02E 10/544* (2013.01)

(58) Field of Classification Search
CPC ............. H01L 25/045; H01L 31/0687; H01L 31/0693; H01L 31/043
USPC ................................................ 136/256, 255
See application file for complete search history.

(56) References Cited

U.S. PATENT DOCUMENTS

| 4,385,198 | A | * | 5/1983 | Rahilly ............... H01L 31/0288 136/249 |
| 5,021,099 | A | * | 6/1991 | Kim ...................... H01L 31/042 136/244 |
| 5,403,404 | A | | 4/1995 | Arya et al. |
| 5,853,497 | A | * | 12/1998 | Lillington ........... H01L 31/0687 136/249 |
| 6,057,505 | A | * | 5/2000 | Ortabasi ....................... 136/246 |
| 6,372,981 | B1 | * | 4/2002 | Ueda ...................... C30B 25/02 117/101 |

(Continued)

OTHER PUBLICATIONS

International Search Report mailed Mar. 6, 2014 for PCT/US2013/63937.

(Continued)

*Primary Examiner* — Allison Bourke
(74) *Attorney, Agent, or Firm* — Medley, Behrens & Lewis, LLC; Aman Talwar

(57) ABSTRACT

A microsystems-enabled multi-junction photovoltaic (MEM-PV) cell includes a first photovoltaic cell having a first junction, the first photovoltaic cell including a first semiconductor material employed to form the first junction, the first semiconductor material having a first bandgap. The MEM-PV cell also includes a second photovoltaic cell comprising a second junction. The second photovoltaic cell comprises a second semiconductor material employed to form the second junction, the second semiconductor material having a second bandgap that is less than the first bandgap, the second photovoltaic cell further comprising a first contact layer disposed between the first junction of the first photovoltaic cell and the second junction of the second photovoltaic cell, the first contact layer composed of a third semiconductor material having a third bandgap, the third bandgap being greater than or equal to the first bandgap.

15 Claims, 4 Drawing Sheets

(56) References Cited

U.S. PATENT DOCUMENTS

| | | |
|---|---|---|
| 6,992,334 B1 | 1/2006 | Wierer, Jr. et al. |
| 7,071,407 B2 | 7/2006 | Fatemi et al. |
| 7,615,400 B2 | 11/2009 | Goto et al. |
| 7,709,287 B2 | 5/2010 | Fatemi et al. |
| 7,807,921 B2 | 10/2010 | Fetzer et al. |
| 8,190,386 B2 | 5/2012 | Fafard |
| 2004/0045598 A1 | 3/2004 | Narayanan et al. |
| 2004/0166681 A1 | 8/2004 | Iles et al. |
| 2005/0166957 A1* | 8/2005 | Imoto et al. ............... 136/263 |
| 2005/0199281 A1* | 9/2005 | Fatemi ............ H01L 31/03046 136/255 |
| 2006/0162768 A1* | 7/2006 | Wanlass et al. ............. 136/262 |
| 2010/0122724 A1 | 5/2010 | Cornfeld et al. |
| 2011/0011983 A1* | 1/2011 | King .................... H01L 31/036 244/172.7 |
| 2011/0017298 A1* | 1/2011 | Lee ............................ 136/261 |
| 2011/0220190 A1* | 9/2011 | Lee .................. H01L 31/03046 136/255 |
| 2011/0297213 A1* | 12/2011 | Tsutagawa ......... H01L 31/0687 136/255 |
| 2012/0180842 A1 | 7/2012 | Chen et al. |

OTHER PUBLICATIONS

Bhattacharya, Fornari, Kamimura (Eds.), Comprehensive Semiconductor Science and Technology (online), vol. 3, Jan. 28, 2011.

Kurtz, et al., "Projected Performance of Three and Four-Junction Devises Using GaAs and GaInP", 26th IEEE Photovoltaic Specialists Conference, 1997, pp. 1-5.

Yamaguchi, et al., "Multi-junction III-V Solar Cells: Current Status and Future Potential", Solar Energy vol. 79, 2005, pp. 78-85.

* cited by examiner

TRANSPARENT CONTACTS FOR STACKED COMPOUND PHOTOVOLTAIC CELLS

STATEMENT OF GOVERNMENTAL INTEREST

This invention was developed under Contract DE AC04-94AL85000 between Sandia Corporation and the U.S. Department of Energy. The U.S. Government has certain rights in this invention.

BACKGROUND

Multi-junction photovoltaic cells have achieved high efficiencies relative to other types of photovoltaic cells. A high cost of materials and manufacture, a low price to performance ratio, and other factors inhibit widespread adoption thereof. Multi-junction photovoltaic cells comprise multiple junctions tuned to absorbing different wavelengths of light. Monolithically integrated multi-junction photovoltaic (MIMJ-PV) cells consist of multiple junctions that are mechanically and electrically connected, and are generally more efficient than single junction cells, but are far more costly to produce. Additionally, such cells are restricted by lattice matching considerations for material growth, and are still further restricted by requiring current matching, such that a cell can be optimized with respect to a single particular input spectrum (e.g., if the input spectrum changes, the cell will not operate optimally).

SUMMARY

The following is a brief summary of subject matter that is described in greater detail herein. This summary is not intended to be limiting as to the scope of the claims.

Various technologies pertaining to microsystems-enabled multi-junction photovoltaic (MEM-PV) cells are described herein. A MEM-PV cell is an integrated multi-junction photovoltaic cell. Cells of such type can be produced by way of semiconductor manufacturing techniques, such that the cells are relatively small (e.g., between 100 µm and 5 mm in diameter) and relatively thin (e.g., between 1 µm and 2 mm). A MEM-PV cell comprises a plurality of cells that are mechanically bonded into a vertical stack. Each cell comprises a junction, and the cells are arranged in the vertical stack such that absorbing semiconductor materials in the respective cells are arranged in order of decreasing bandgap from the face exposed to light. A contact layer of a cell in the MEM-PV cell has a bandgap that is selected such that the contact layer acts as a window layer in the MEM-PV cell; that is, solar radiation not absorbed by a cell higher in the vertical stack passes through the contact layer, such that the solar radiation can be absorbed by a cell lower in the vertical stack. In other words, a respective contact layer is transparent with respect to soar radiation not absorbed by semiconductor materials higher in the vertical stack of the MEM-PV cell.

Moreover, it is to be understood that contact layers may have substantially planar surfaces, thereby promoting use of microsystems technology, such as wafer bonding technology, to intimately bond two cells. Specifically, the contact layers are un-etched. Intimate bonding of cells refers to bonding of cells such that the bond is substantially free of voids and/or defects.

Each cell in the MEM-PV cell can be independently contacted via metal stacks or a metallized coating added to a contact layer. Different metal stacks may be used depending on the respective contact layer material. Further, the plurality of cells in the vertical stack may be arranged in order of decreasing diameter, from the top of the vertical stack to the bottom of the vertical stack, such that a portion of a contact applied to each cell is exposed on the exterior of the MEM-PV cell. Each cell in the plurality of cells may thus be individually contacted, such as by applying traces to each exposed contact portion. It is to be understood that the metal stacks need not intrude onto an optical aperture of the cells, thereby maintaining relatively planar surfaces for bonding. This is due to the relatively small area of such cells.

Other aspects will be appreciated upon reading and understanding the attached figures and description.

DETAILED DESCRIPTION

Figure 1:
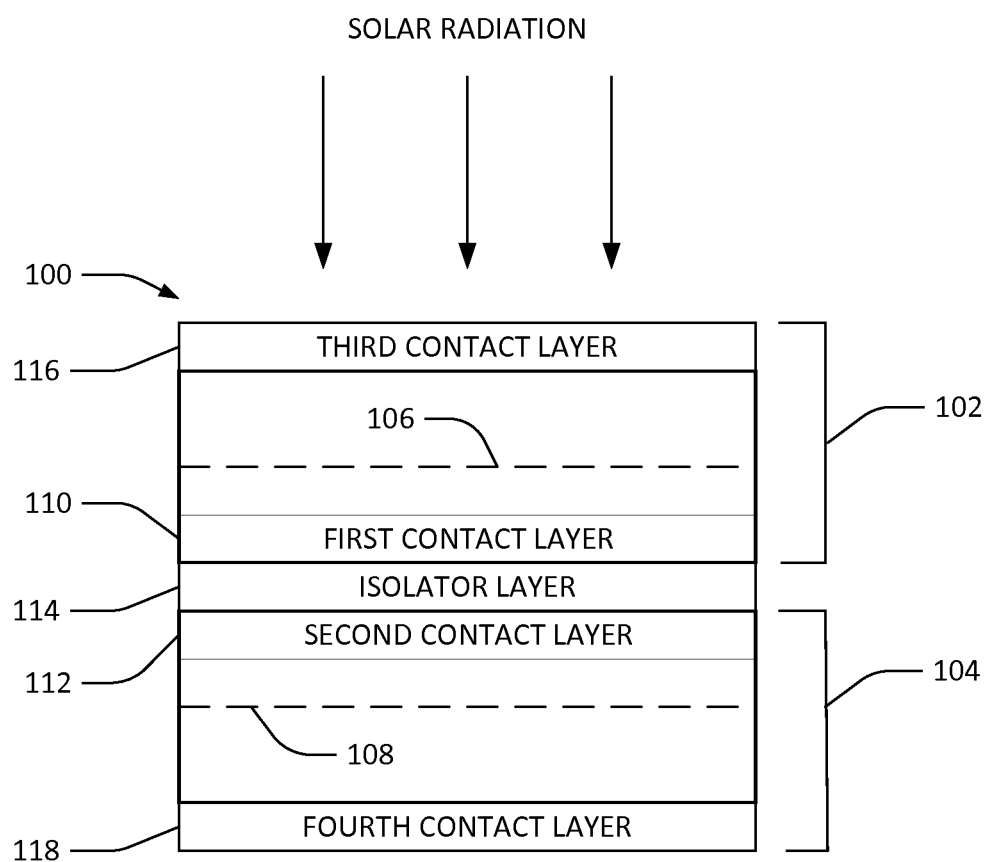
FIG. 1 is a cross-sectional view of an exemplary MEM-PV cell.

Various technologies pertaining to microsystems-enabled multi-junction photovoltaic (MEM-PV) cells will now be described with reference to the drawings, where like reference numerals represent like elements throughout. Additionally, as used herein, the term "exemplary" is intended to mean serving as an illustration or example of something, and is not intended to indicate a preference.

With reference to FIG. 1, a cross-sectional view of an exemplary MEM-PV cell 100 is illustrated. A MEM-PV cell is an intimately integrated multi-junction photovoltaic cell comprising a plurality of separately processed photovoltaic cells. Cells of such type can be produced by way of semiconductor manufacturing techniques, such that the cells are relatively small (e.g., between 100 µm and 5 mm in diameter) and relatively thin (e.g., between 0.5 µm and 2 mm). The MEM-PV cell 100 comprises a first cell 102 and a second cell 104 arranged in a vertical stack. Position of a cell in the vertical stack is described with reference to traversal of solar radiation therethrough; thus, as shown, the first cell 102 is above the second cell 104 in the vertical stack, as the first cell 102 receives solar radiation prior to the second cell 104 receiving the solar radiation.

The first cell 102 and the second cell 104 can each have a diameter, for instance, between 0.1 mm and 5 mm, and of a thickness of between 0.5 µm and 100 µm. The first cell 102 and the second cell 104 comprise a first junction 106 and a second junction 108, respectively. First semiconductor material is employed to form the first junction 106, while second semiconductor material is employed to form the second junction. In an exemplary embodiment, the first junction 106 and the second junction 108 can be p-n junctions, although the MEM-PV cell 100 is not so limited. For example, the first junction 106 and the second junction 108 can be p-i-n junctions. The bandgap of the first semiconductor material is higher than bandgaps of respective semiconductor materials employed to form junctions lower in the vertical stack. Thus, the first semiconductor material absorbs solar radiation of wavelengths with higher energy than the bandgap of the first semiconductor material, while solar radiation of wavelengths with lower energy than the bandgap of the first semiconductor will pass through the first semiconductor material and be absorbed by the subsequent semiconductor materials.

The first cell 102 comprises a first contact layer 110 composed of a third semiconductor material, and the second cell 104 comprises a second contact layer 112 composed of a fourth semiconductor material. The cell 100 further comprises an isolator layer 114 that electrically isolates the first contact layer 110 from the second contact layer 112. Accordingly, the isolator layer 114 can be composed of a suitable dielectric. The first contact layer 110, in an exemplary embodiment, can be a negative contact layer for the first cell 102, while the second contact layer 112 can be a positive contact layer for the second cell 104. As shown, the first contact layer 110 and the second contact layer 112 extend throughout the diameter of the cell; that is, the first contact layer 110 and the second contact layer 112 are un-etched. The surfaces of the first contact layer 110 and the second contact layer 112 are substantially planar, thus facilitating bonding of the first cell 102 and the second cell 104 by way of the isolator layer 114. The first cell 102 and the second cell 104 can be bonded using a wafer activation process (e.g., wafer bonding), a metal to metal wafer bond, through an epoxy or polymer, or other suitable technique.

As will be understood, the first cell 102 comprises a third contact layer 116, which has a polarity opposite that of the first contact layer 110. Similarly, the second cell 104 comprises a fourth contact layer 118 that has a polarity opposite that of the second contact layer 112. The first cell 102 can be independently contacted by way of the first contact layer 110 and the third contact layer 116. Likewise, the second cell 104 can be independently contacted by way of the second contact layer 112 and the fourth contact layer 118. A bandgap of a semiconductor material utilized for the third contact layer 116 can be sufficiently high to act as a window layer with respect to the first junction 106.

In an exemplary embodiment, bandgaps of the third semiconductor material and the fourth semiconductor material, respectively, can be relatively high compared to conventional materials utilized to form contacts in multi-junction cells. Specifically, the bandgap of the third semiconductor material and the bandgap of the fourth semiconductor material are respectively either equal to or greater than the bandgap of the first semiconductor material (of the first cell 102). Thus, the first contact layer 110 and the second contact layer 112 act as a window layer, such that solar radiation having wavelengths that are not absorbed by the first semiconductor material passes through the first contact layer 110 and the second contact layer 112 as well.

The type of semiconductor material to employ as the third semiconductor material and the fourth semiconductor material, as well as thickness of the first contact layer 110 and the second contact layer 112, can be based upon their respective bandgaps, metal contacts applied to the first contact layer 110 and the second contact layer 112, and spreading resistance of the respective semiconductor materials. Thicknesses of the first contact layer 110 and the second contact layer 112 can be selected to allow for low spreading resistance, as well as to be suitably thick such that metals from metal stacks do not diffuse through the respective contact layers. In an exemplary embodiment, thickness of the first contact layer 110 and/or the second contact layer can be between 0.1 µm and 3 µm. Further, in an exemplary embodiment, spreading resistance can be between, for instance, 0.001 and 10 ohms.

Figure 2:
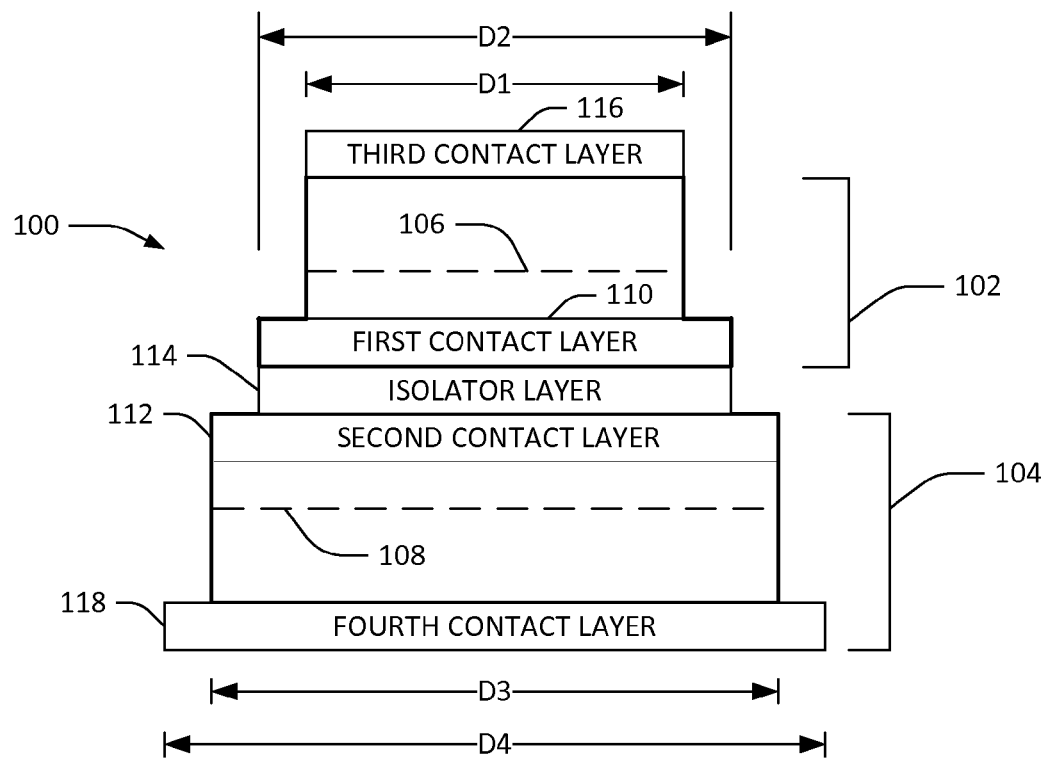
FIG. 2 is a cross-sectional view of an exemplary inter-cell bond between two cells of an MEM-PV cell.

Referring now to FIG. 2, another cross-sectional view of a portion of the exemplary MEM-PV cell 100 is illustrated. The MEM-PV cell 100 comprises the first cell 102, which includes the first junction 106, the first contact layer 110, and the third contact layer 116. The MEM-PV cell 100 further comprises the second cell 104, which includes the second junction 108, the second contact layer 112, and the fourth contact layer 118. As noted above, the first contact layer 110 and the second contact layer 112 have substantially planar surfaces, such that the first cell 102 and the second cell 104 can be intimately bonded by way of the isolator layer 114.

As shown, an upper portion of the first cell 102 has a diameter D1, the first contact layer 110 has a diameter D2, the second contact layer has a diameter D3, and the fourth contact layer 118 has a diameter D4, wherein D1 is less than D2, D2 is less than D3, and D3 is less than D4. Formation of the MEM-PV cell 100 in this manner allows for the first cell 102 and the second cell 104 to be independently contacted on the exterior of the MEM-PV cell 100.

Figure 3:
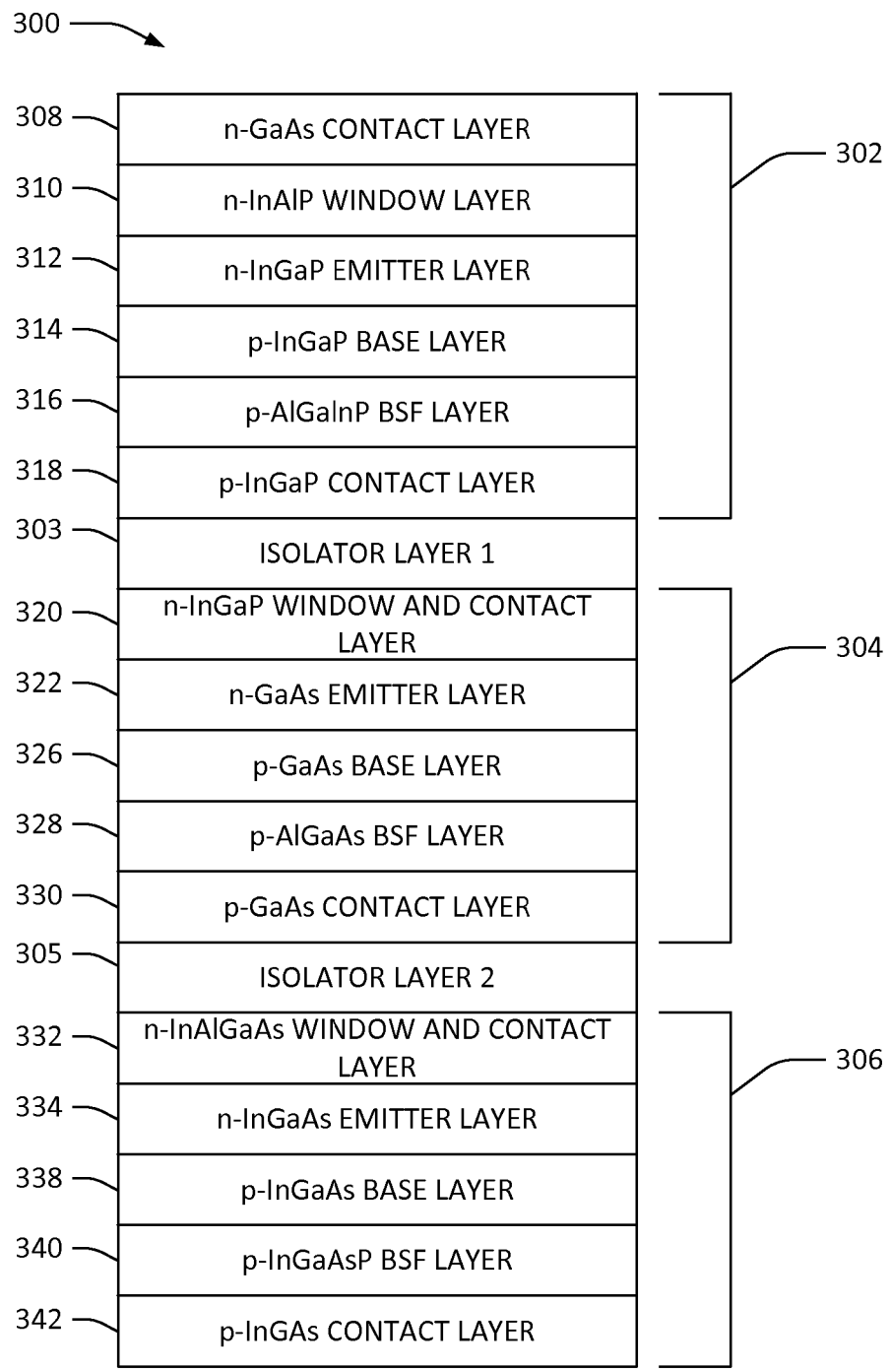
FIG. 3 is a cross-sectional view of an exemplary MEM-PV cell.

Referring now to FIG. 3, an exemplary MEM-PV cell 300 is illustrated. The MEM-PV cell comprises a first cell 302, a first isolator layer 303, a second cell 304, a second isolator layer 305, and a third cell 306. The first isolator layer 303 and the second isolator layer 305 are composed of a suitable dielectric, such that the first isolator layer 303 substantially electrically isolates the first cell 302 and the second cell 304, and the second isolator layer 305 substantially electrically isolates the second cell 304 and the third cell 306. As shown, the first cell 302 can be an Indium-Gallium-Phosphide (InGaP) cell, the second cell 304 can be a Gallium-Arsenide (GaAs) cell, and the third cell 306 can be an Indium-Gallium-Arsenide (InGaAs) cell, although such cell types are set forth for purposes of explanation and are not intended to limit the scope of the claims. Additionally, the exemplary MEM-PV cell 300 can comprise additional types of cells, such as, for example, an Indium-Gallium-Arsenide-Phosphide (InGaAsP) cell, which can be integrated in the MEM-PV cell 300 between the GaAs cell and the InGaAs cell. In another exemplary embodiment, a silicon (Si) cell can be integrated between the GaAs cell and the InGaAs cell, or potentially between the GaAs cell and the InGaAsP cell.

In the exemplary MEM-PV cell 300 shown in FIG. 3, the first solar cell 302 comprises, in vertical order, an n-GaAs contact layer 308, an n-InAlP window layer 310, an n-InGaP emitter layer 312, a p-InGaP base layer 314, a p-AlGaInP back-surface field (BSF) layer 316, and a p-InGaP contact layer 318. A p-n junction is formed between the n-InGaP emitter layer 312 and the p-InGaP base layer 314. A bottom surface of the P-InGaP contact layer 318 can be substantially planar. It can be ascertained that, in the first solar cell 302, other materials can be employed for the various window and contacting layers, provided that such materials meet the cell design specifications. The material employed to form the contact layer 308 can be selected to minimize light absorption therein (e.g., a relatively high bandgap material), such as to allow for as much light as possible to be transmitted through the cell structure. The material employed to form the contact layer 318 can be selected such that the contact layer 318 does not absorb light that is to be absorbed by junctions lower in the vertical stack.

The second cell 304 is intimately integrated with the first solar cell 302 by way of the first isolator layer 303. For instance, the first isolator layer 303 can be positioned on the second solar cell 304, and the first solar cell 302 can be stacked thereon and integrated with the second solar cell 304 by way of, for instance, bonding techniques. With more specificity, the second cell 304 comprises an n-InGaP window and contact layer 320, an n-GaAs emitter layer 322, a p-GaAs base layer 326, a p-AlGaAs BSF layer 328, and a p-GaAs contact layer 330. A bottom surface of the p-GaAs contact layer 330 can be substantially planar. Additionally, a top surface of the InGaP window and contact layer 320 can be substantially planar, such that minimal air gaps are located between the p-InGaP contact layer 318 of the first cell 302, the isolator layer 303, and the n-InGaP window and contact layer 320 of the second cell 304. As noted above, a bandgap of n-InGaP is greater than or equal to the bandgap of the absorbing layers of the first cell 302 (also InGaP). It is again to be noted that within the second solar cell other materials can be used for the various window and contacting layers, provided that such materials meet the specifications of the cell design and allow for light to be transmitted through the cell structure in such a way that light is only absorbed within the junction and not within the window and contacting layers.

The third cell 306 comprises an n-InAlGaAs window and contact layer 332, an n-InGaAs emitter layer 334, a p-InGaAs base layer 338, a p-InGaAsP BSF layer 340, and a p-InGaAs contact layer 342. A top surface of n-InAlGaAs window and contact layer 332 can be substantially planar, such that minimal air gaps are located between the P-GaAs contact layer 330 of the second cell 304, the second isolator layer 305, and the n-InAlGaAs window and contact layer 332 of the third cell 306. Bandgaps of the n-InAlGaAs window and contact layer 332 and the p-GaAs contact layer 330 are greater than or equal to the bandgap of the absorbing layers of the second cell 304 (GaAs). Therefore, solar radiation at wavelengths not absorbed by an absorbing layer can reach lower cells in the vertical stack. Further, while not shown, the MEM-PV cell 300 can be structured similar to the structure shown in FIG. 2, such that the first cell 302, the second cell 304, and the third cell 306 can be independently contacted at the exterior of the MEM-PV cell 300. It is again to be noted that, within the third solar cell 306, other materials can be used for the various window and contacting layers, provided that such materials meet the specifications of the cell design and allow for the light to be transmitted through the cell structure in such a way that light is only absorbed within the junction and not within the window and contacting layers.

Table 1, set forth below, illustrates exemplary metal stacks that can be employed with the contact layers shown in FIG. 3 to achieve low resistance ohmic contacts. It is to be understood that such metal stacks are not an exclusive set of metal stacks that can be employed.

| CONTACT MATERIAL | METAL STACK |
|---|---|
| n-GaAs | Au/Ge/Ni/Au |
| p-InGaP | AuBe/Ni/Au |
| n-InGaP | GeAu/Ni/Au |
| p-GaAs | Ti/Pt/Au |
| n-InGaAsP | Ti/Au/Ag/Au |

Figure 4:
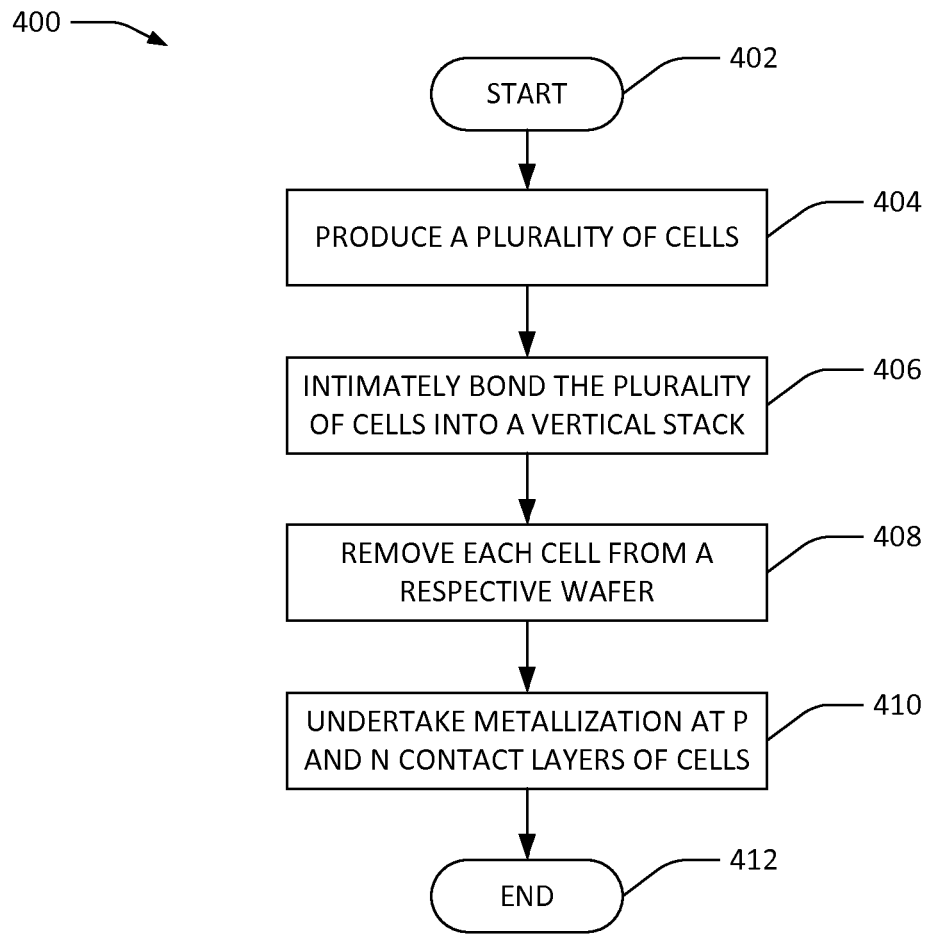
FIG. 4 is flow diagram that illustrates an exemplary methodology for producing an MEM-PV cell.

With reference now to FIG. 4, an exemplary methodology is illustrated and described. While the methodology is described as being a series of acts that are performed in a sequence, it is to be understood that the methodology is not limited by the order of the sequence. For instance, some acts may occur in a different order than what is described herein. In addition, an act may occur concurrently with another act. Furthermore, in some instances, not all acts may be required to implement a methodology described herein.

Referring now to FIG. 4, a methodology 400 that facilitates producing a MEM-PV cell is illustrated. The methodology 400 begins at 402, and at 404, a plurality of cells is produced, wherein the plurality of cells include cells of different type (e.g., different absorbing materials). At least one cell in the plurality of cells has a contact layer composed of a material with a high bandgap compared to bandgaps conventionally employed in multi-junction cells.

At 406, the plurality of cells is bonded into a vertical stack such as, for example, through wafer bonding. The plurality of cells is arranged in the vertical stack such that semiconductor materials that are configured to absorb solar radiation are positioned in the vertical stack in decreasing order, such that materials with higher bandgaps are positioned above materials with lower bandgaps. At least one cell has a contact layer that is selected such that the bandgap of the material of the contact layer is higher than or equal to the lowest bandgap associated with a semiconductor material used to form an absorbing junction above the contact layer in the vertical stack. At 408, each of the plurality of cells is removed from a respective wafer through any suitable technique, such as epitaxial liftoff. At 410, metallization is undertaken to cause p and n sides of each cell to be accessible, such that each cell in the vertical stack is independently contactable. The methodology 400 completes at 412.

It is noted that several examples have been provided for purposes of explanation. These examples are not to be construed as limiting the hereto-appended claims. Additionally, it may be recognized that the examples provided herein may be permutated while still falling under the scope of the claims.

What is claimed is:

1. A microsystems-enabled multi-junction photovoltaic (MEM-PV) cell comprising:
    a first photovoltaic cell over a second photovoltaic cell, wherein the first photovoltaic cell comprises:
        a first semiconductor junction over a first contact layer, wherein the first semiconductor junction comprises InGaP, and wherein the first contact layer comprises InGaP; and
        a back surface field (BSF) layer over the first contact layer, wherein the BSF layer comprises AlGaInP, wherein the BSF layer is in physical contact with the first contact layer;
    wherein the second photovoltaic cell comprises:
        a second semiconductor junction, wherein the second semiconductor junction has a bandgap that is less than a bandgap of the first semiconductor junction; and
    an electrical isolation layer between the first photovoltaic cell and the second photovoltaic cell.

2. The MEM-PV cell of claim 1, further comprising a window layer over the first semiconductor junction.

3. The MEM-PV cell of claim 2, wherein the window layer comprises InAlP.

4. The MEM-PV cell of claim 1, further comprising a second contact layer over the first semiconductor junction.

5. The MEM-PV cell of claim 4, wherein the second contact layer comprises GaAs.

6. The MEM-PV cell of claim 1, wherein the second semiconductor junction comprises GaAs.

7. The MEM-PV cell of claim 1, further comprising a first metal stack applied to the first contact layer, wherein the metal stack comprises AuBe/Ni/Au.

8. The MEM-PV cell of claim 4, further comprises a second metal stack applied to the second contact layer, wherein the second metal stack comprises Au/Ge/Ni/Au.

9. A microsystems-enabled multi junction photovoltaic (MEM-PV) cell comprising:

a first photovoltaic cell over a second photovoltaic cell, wherein the first photovoltaic cell comprises:
  a first semiconductor junction over a back surface field (BSF) layer; and
  a first contact layer over the first semiconductor junction,
wherein the first semiconductor junction comprises InGaP and the first contact layer comprises GaAs;
wherein the second photovoltaic cell comprises:
  a second semiconductor junction over a second contact layer;
  a third contact layer over the second semiconductor junction;
an electrical isolation layer over the second photovoltaic cell, and
a fourth contact layer between the BSF layer and the electrical isolation layer, wherein the fourth contact layer comprises InGaP, wherein the fourth contact layer is in physical contact with the BSF layer.

10. The MEM-PV cell of claim 9, wherein the BSF layer comprises AlGaInP.

11. The MEM-PV cell of claim 9, further comprising a window layer between the first semiconductor junction and the first contact layer, wherein the window layer comprises InAlP.

12. The MEM-PV cell of claim 9, wherein at least one of the second semiconductor junction or the second contact layer comprises InGaAs.

13. The MEM-PV cell of claim 9, wherein the third contact layer comprises InAlGaAs.

14. The MEM-PV cell of claim 9, wherein a bandgap of the second semiconductor junction is less than a bandgap of the first semiconductor junction.

15. The MEM-PV cell of claim 9, wherein the fourth contact layer is in physical contact with the BSF layer.

* * * * *